US009345182B2

(12) United States Patent
Finneran

(10) Patent No.: US 9,345,182 B2
(45) Date of Patent: May 17, 2016

(54) EMI SHIELDING VENT PANEL FRAME

(71) Applicant: PARKER-HANNIFIN CORPORATION, Cleveland, OH (US)

(72) Inventor: Kevin W. Finneran, Boston, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 14/331,281

(22) Filed: Jul. 15, 2014

(65) Prior Publication Data
US 2015/0060130 A1 Mar. 5, 2015

Related U.S. Application Data

(60) Provisional application No. 61/870,504, filed on Aug. 27, 2013.

(51) Int. Cl.
H05K 9/00 (2006.01)

(52) U.S. Cl.
CPC .................... *H05K 9/0041* (2013.01)

(58) Field of Classification Search
CPC .................................... H05K 9/0041
USPC .......................................... 174/383
See application file for complete search history.

(56) References Cited

U.S. PATENT DOCUMENTS

| 3,546,359 A | 12/1970 | Ciccarelli |
| 3,553,343 A | 1/1971 | Garlington |
| 3,580,981 A | 5/1971 | Lamp |
| 3,584,134 A | 6/1971 | Nichols |
| 3,821,463 A | 6/1974 | Bakker |
| 4,249,033 A | 2/1981 | Darakjy |
| 4,616,101 A | 10/1986 | Veerman |
| 4,851,608 A | 7/1989 | Seip |
| 4,857,668 A | 8/1989 | Buonanno |
| 4,952,448 A | 8/1990 | Bullock |
| 5,007,946 A | 4/1991 | Babini |
| 5,028,739 A | 7/1991 | Keyser |
| 5,032,689 A | 7/1991 | Halligan |
| 5,105,056 A | 4/1992 | Hoge, Jr. |
| 5,142,101 A | 8/1992 | Matsuzaki |

(Continued)

FOREIGN PATENT DOCUMENTS

| JP | 8064988 | 3/1996 |
| WO | WO 9732459 A1 | 9/1997 |

Primary Examiner — Timothy Thompson
Assistant Examiner — Paul McGee, III
(74) Attorney, Agent, or Firm — Renner, Otto, Boisselle & Sklar, LLP

(57) ABSTRACT

An electromagnetic interference (EMI) shielded vent panel for disposition over an opening of an electronics enclosure is provided. The panel includes an electrically-conductive medium having an outer periphery supported within an electrically-conductive frame. The frame is configured as having a generally C-shaped or U-shaped cross-sectional profile, and includes an elongate end wall, and a pair of opposed side walls extending inwardly from the end wall to contact and secure the medium. Preferably, the medium includes individual cells forming a honeycomb structure. The frame is provided with a series of vertical posts extending between the opposed side walls of the frame to reduce the formation of foreign object debris caused by holes drilled in the frame to receive screws or bolts for mounting the vent panel to the opening of an electronics enclosure. The posts also provide additional structural integrity and rigidity for the frame member.

6 Claims, 5 Drawing Sheets

(56) References Cited

U.S. PATENT DOCUMENTS

| | | | |
|---|---|---|---|
| 5,202,536 A | 4/1993 | Buonanno | |
| 5,208,425 A | 5/1993 | Hasegawa | |
| 5,401,914 A | 3/1995 | Curran | |
| 5,895,885 A | 4/1999 | Kunkel | |
| 5,910,639 A | 6/1999 | Kunkel | |
| 6,211,458 B1 * | 4/2001 | Mitchell | H05K 9/0041 174/383 |
| 6,279,446 B1 | 8/2001 | Halket | |
| 6,362,417 B2 | 3/2002 | Mitchell | |
| 6,426,459 B1 | 7/2002 | Mitchell | |
| 6,710,241 B2 | 3/2004 | Casper | |
| 6,870,092 B2 * | 3/2005 | Lambert | H05K 9/0041 174/355 |
| 7,038,124 B1 | 5/2006 | Sosnowski | |
| 7,575,708 B2 | 8/2009 | DeGrange | |
| 7,838,780 B2 | 11/2010 | Soares | |

* cited by examiner

SECTION A-A

EMI SHIELDING VENT PANEL FRAME

CROSS-REFERENCE TO RELATED APPLICATIONS

This application claims priority to U.S. Provisional Patent Application No. 61/870,504, filed Aug. 27, 2013, the disclosure of which is incorporated herein in its entirety by reference thereto.

BACKGROUND OF THE INVENTION

The present invention relates to an improved EMI shielding vent panel assembly comprising, in combination, a porous electrically-conductive media and an electrically-conductive frame member for supporting the media. The vent panel of the invention is adapted to cover a corresponding opening in an electronics housing or enclosure to provide ventilation while maintaining electrical continuity and EMI shielding effectiveness across the opening. The vent panel is designed to eliminate the possibility of foreign object debris ("FOD") contamination upon assembly and mounting of the vent onto the opening by providing series of posts in the vent panel frame for accommodating a series of mounting screws or bolts. The vent panel of the invention is particularly adapted for use in aircraft and military environments where FOD can be a persistent problem.

In general, the operation of electronic devices such as monitors, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI". EMI is known to interfere with the operation of other proximate electronic devices. "EMI" is used herein interchangeably with the term "radio frequency interference" ("RFI").

For attenuating EMI effects, suitable EMI shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and most often is configured as an electrically conductive and grounded housing or other enclosure which surrounds the EMI generating circuitry of the source device. However, when such circuitry is contained within the confined space of an enclosure, it often is necessary to provide a cooling or ventilation means to dissipate the heat which is generated by the circuitry. Most enclosures therefore are formed with one or more air intake and/or exhaust openings or ports for natural or forced convective circulation of air between the interior of the enclosure and the ambient environment.

Left uncovered, such openings would represent a discontinuity in the surface and ground conductivity of the enclosure, with the result of a decrease in the EMI shielding effectiveness of the enclosure. Accordingly, shielded vent panels have been used for covering the openings in an manner which allows ventilation of the enclosure while electrical continuity, i.e., grounding, across the vent opening is maintained.

In basic construction, such vent panels, which are sized to span the corresponding opening in the enclosure, conventionally are formed from a sheet of a porous, electrically-conductive shielding media, i.e. a vent opening, and an electrically-conductive frame member configured to support the media by circumscribing the outer periphery thereof. The media, which may be an expanded metal mesh or, alternatively, a honeycombed-structured or other cellular structured metal, is received in or is otherwise attached to the frame, which typically is provided as an extruded aluminum, stainless steel, Monel, or other metals. The frame, in turn, may be fastened to the enclosure over the opening thereof with screws or the like, and a compressible, electrically-conductive seal or gasket is optionally provided for improved electrical contact between the frame and the enclosure.

Conventional panels typically employ a C-shaped or U-shaped frame channel, with the periphery of the media being received within the channel. The sides of the channel can be compressed to engage and lock the media and to thereby establish good electrical contact between the media and frame. Vent panels of such type are marketed commercially by the Chomerics Division of the Parker-Hannifin Corp. under the tradenames "Cho-Cell™", "Shield Cell®", "Omni Cell®", "Slimvent™", and "Streamshield™". Alternatively, the media may be fit into the frame and then bonded thereto using a conventional joining technique such as resistance welding, brazing, soldering, or the like. Vent panels of this type are also marketed commercially by the Chomerics Division of Parker-Hannifin Corp.

EMI shielding vents are also described in the following patents: U.S. Pat. Nos. 6,426,459; 6,362,417; and 6,211,458; 5,032,689; 5,208,425; 6,279,446; 6,710,241; 7,038,124; 7,575,708 and 7,838,780. Other vents and materials therefor are described in U.S. Pat. Nos. 3,546,359; 3,580,981; 3,553,343; 3,584,134; 3,821,463; 4,616,101; 4,249,033; 4,616,101; 4,851,608; 5,007,946; 5,401,914; 5,895,885; and 5,910,639, JP 8064988, and WO 97/32459.

In view of the proliferation of electronic devices, it is to be expected that continued improvements in EMI shielded vent panels would be well-received by the industry, and particularly by the designers of enclosures for personal computers, file servers, telecommunication equipment, and similar systems which now operate at frequencies of 500 MHz or more. Indeed, as the processing speeds of electronic devices continue to increase with the attendant generation of higher frequency EMI radiation and greater heat output, enclosure designers are faced with the seemingly competing requirements of providing both adequate ventilation and effective EMI shielding. In such applications, a honeycomb shielding media, such as is disclosed in U.S. Pat. Nos. 3,821,463; 5,895,885; and 5,910,639, often may be preferred over other media as it is known to provide effective EMI shielding at higher frequencies with less restriction to air flow. Moreover, certain applications may specify a cast or similar-type frame construction which, in contrast to an extrusion, may be formed without corner seams and, as a result, may be made more structurally rigid and may be formed into more complex shapes. Ultimately, a preferred vent construction would be economical to manufacture, and would exhibit both reliable EMI shielding performance and good ventilation even in high frequency applications.

It will be appreciated that it would be of considerable advantage to develop an improved vent panel which exhibits reliable EMI shielding and air flow characteristics, which is economical to manufacture, which has structural integrity, and which reduces or eliminates foreign object debris during assembly or mounting of the vent panel to the opening of an electronics enclosure. These and other advantages will be readily apparent to those skilled in the art based upon the disclosure contained herein.

The disclosure of each of the patents set forth above is incorporated by reference herein in their entirety.

SUMMARY OF THE INVENTION

The present invention is directed to an EMI shielded vent construction including an electrically-conductive frame member having a generally U-shaped or C-shaped profile, including an end wall portion and a pair of side wall portions integral with the end wall portion, and an electrically-conductive, porous shielding medium member, which is supported by the frame member. In particular, the periphery of the porous electrically-conductive medium is engaged within the open section of the frame member which may be compressed, such as within a hydraulic platen press or the like, to retain the medium member therein. The frame member is provided with a series of vertical posts extending between the side wall portions of the frame. These posts serve to minimize the generation of foreign object debris (FOD) by providing a surface for drilling, while also serving to support the frame and provide rigidity to the frame structure.

In one disclosed embodiment, the frame member is formed of aluminum or another metal, with the medium being formed of a layer of an aluminum or other metal foil which is folded, bent, or otherwise shaped into a cellular honeycomb structure to extend along a transverse axis intermediate a generally planar first and second face. Other metals which may be used for the vent panel include stainless steel, nickel, titanium, and alloys or mixtures thereof.

In another disclosed embodiment, an electromagnetic interference (EMI) shielded vent panel construction for disposition over a corresponding opening formed within a surface of an electronics enclosure is provided. The vent panel includes an electrically-conductive medium having an outer periphery and extending along a transverse axis intermediate a pair of faces defining a thickness dimension. The medium is supported within an electrically-conductive frame having a perimeter defining a closed geometric area selected to circumscribe the opening of the electronics enclosure. The frame is configured as having a generally C-shaped or U-shaped cross-sectional profile, with the open end of the frame extending inwardly and contacting the medium. A series of posts are provided extending between opposed frame side walls for drilling holes to receive attachment screws or bolts.

In one embodiment, the medium is a honeycomb structure of adjacent cells of varying dimension. Preferably, the cells have generally circular, oval, octagonal, hexagonal, square or rectangular shapes.

In a further embodiment, a suitable EMI gasket can be combined with the vent panel to form a vent panel assembly for attachment to an opening for an electronics enclosure. The vent panel is attached to the opening using screws or bolts passing through the gasket and the posts of the vent panel frame.

The present invention, accordingly, comprises the vent panel possessing the combination of elements and construction methods exemplified in the detailed disclosure to follow. Advantages of the present invention include a vent panel which exhibits reliable EMI shielding and air flow characteristics, and minimizes the creation of foreign object debris. These and other advantages will be readily apparent to those skilled in the art based upon the disclosure contained herein.

BRIEF DESCRIPTION OF THE DRAWINGS

The foregoing and other advantages and features of the invention will become apparent upon reading the following detailed description with reference to the accompanying drawings in which.

Figure 1:
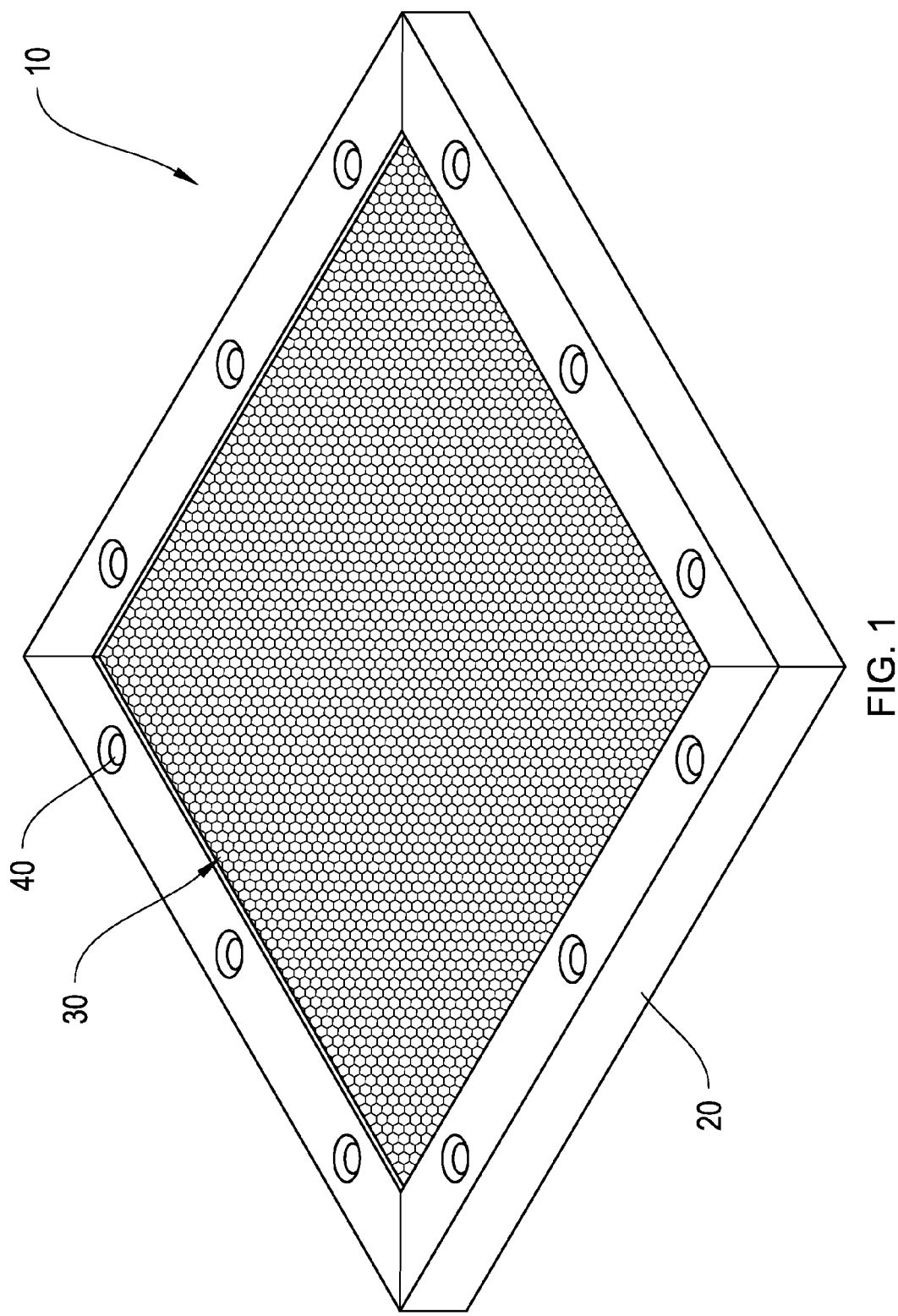
FIG. 1 is a perspective view of the vent panel of the invention.

The drawings will be described further in connection with the following Detailed Description of the Invention.

DETAILED DESCRIPTION OF THE INVENTION

Certain terminology may be employed in the following description for convenience rather than for any limiting purpose. For example, the terms "forward" and "rearward", "front" and "rear", "right" and "left", "upper" and "lower," "top" and "bottom," designate directions in the drawings to which reference is made, with the terms "inward," "inner," "interior "inboard" and "outward," "outer," "exterior," "outside," or "outboard" referring, respectively, to directions toward and away from the center of a referenced element, the terms "radial" or "vertical" and "axial" or "horizontal" referring, respectively, to directions or planes perpendicular and parallel to the longitudinal central axis of a referenced element, i.e. along an x-axis and a y-axis (commonly the length and width). The "thickness" of an element is intended to denote a direction along a z-axis which extends vertically from the plane of the x-axis and y-axis. Terminology of similar import other than the words specifically mentioned above likewise is to be considered as being used for purposes of convenience rather than in any limiting sense.

The term "foreign object debris" or "FOD" is intended to denote extraneous material or debris, such as debris formed as a result of the fabrication or joining of separate elements or components, which due to its presence may cause damage to components.

As used herein, the term "aircraft" is intended to designate both commercial and military aircraft, jet and prop aircraft, including both large commercial and smaller private aircraft.

In the figures, elements having an alphanumeric designation may be referenced herein collectively or in the alternative, as will be apparent from the context, by the numerical portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows or underscores.

FIG. 1 depicts, in general configuration, the EMI shielding vent panel 10 of the invention. Vent panel 10 includes frame member 20 and medium 30. Medium 30 is depicted as a honeycomb configuration comprising a multiplicity of cells joined together in a matrix configuration. In assembled configuration, vent panel 10 is mounted onto a surface of an electronics enclosure, covering the ventilation opening of the enclosure. The vent panel is mounted using, for example, screws, bolts, or other fastening members, over a corresponding opening in the electronics enclosure. The vent panel is designed to provide ventilation without compromising the EMI shielding effectiveness of the electronics enclosure. It will be appreciated, however, that aspects of the present invention may find utility in other EMI shielding applications. For example, vent panel 10 of the invention alternatively may be mounted onto the wall of an EMI shielded room for covering a ventilation opening thereof. Such other applications therefore should be considered to be expressly within the scope of the present invention.

Figure 2:
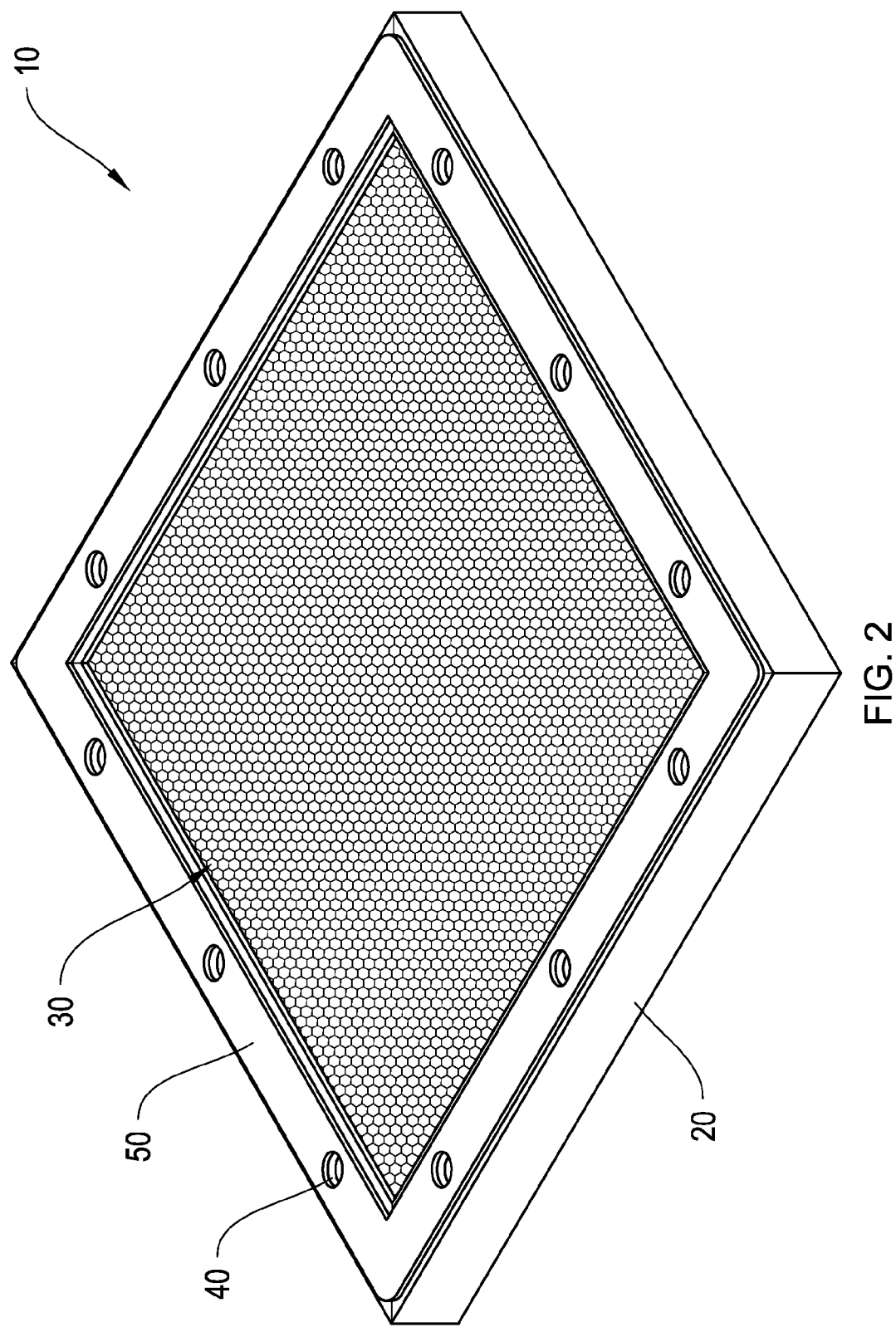
FIG. 2 is a perspective view of the vent panel of FIG. 1 including a mounting gasket for mounting the vent panel to the opening of an electronics enclosure.

Referring next to the remaining figures wherein corresponding reference characters are used to designate corresponding elements, FIG. 2 generally depicts vent panel 10 including electrically-conductive, generally planar medium 30 supported within electrically-conductive frame 20. The frame defines a generally polygonal shape which is sized to circumscribe the margins of a similarly dimensioned vent opening. The polygonal geometry of the frame is appropriately sized to circumscribe the margins of a similarly dimensioned vent opening. Depending upon the configuration of the corresponding opening, however, frame member 20 may be of any closed geometry.

An electrically-conductive EMI sealing gasket 50 can be installed for attaching the vent panel to the corresponding opening of an electronics enclosure. As indicated previously, vent panel 10 is mountable onto the electronics enclosure opening using a plurality of screws, bolts or other fastening members. In this regard, frame member 20 can be provided with a plurality of fastening receiving apertures 40. These apertures are formed in corresponding posts which extend vertically between the side wall sections of the frame as shown (see FIGS. 3 and 4 for more detail). The posts serve to reinforce the frame and to eliminate or reduce the generation of foreign object debris (FOD) when drilled out to accommodate screws or bolts. The posts can be of any shape or size, with the only requirement being that the posts should accommodate the screws or bolts used to attach the vent panel to the opening of the electronics enclosure. Corresponding holes are provided in the sealing gasket to receive bolts or screws for attachment to the opening.

Figure 3:
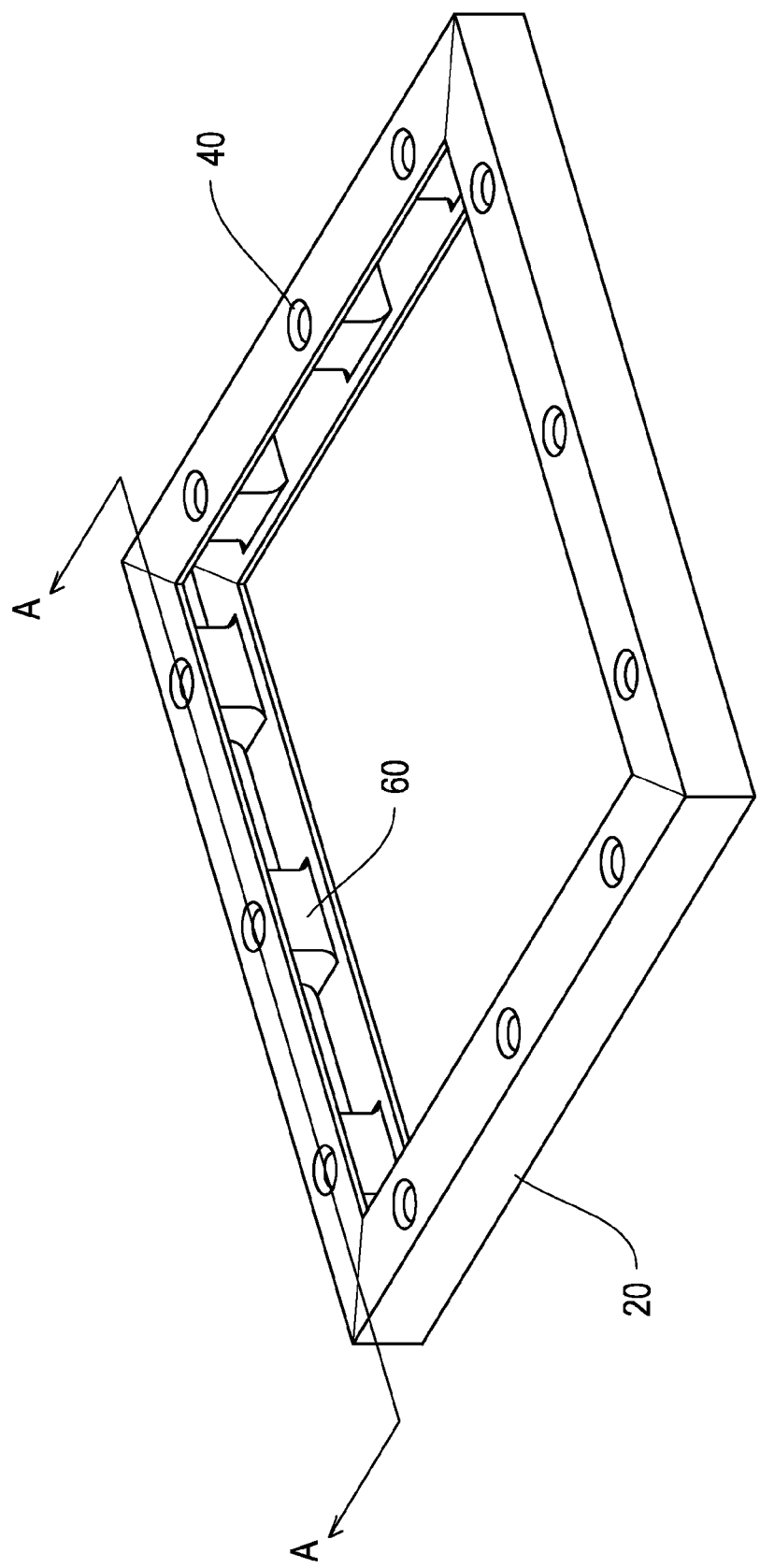
FIG. 3 is a perspective view of the frame of the vent panel of the invention.
Figure 4:
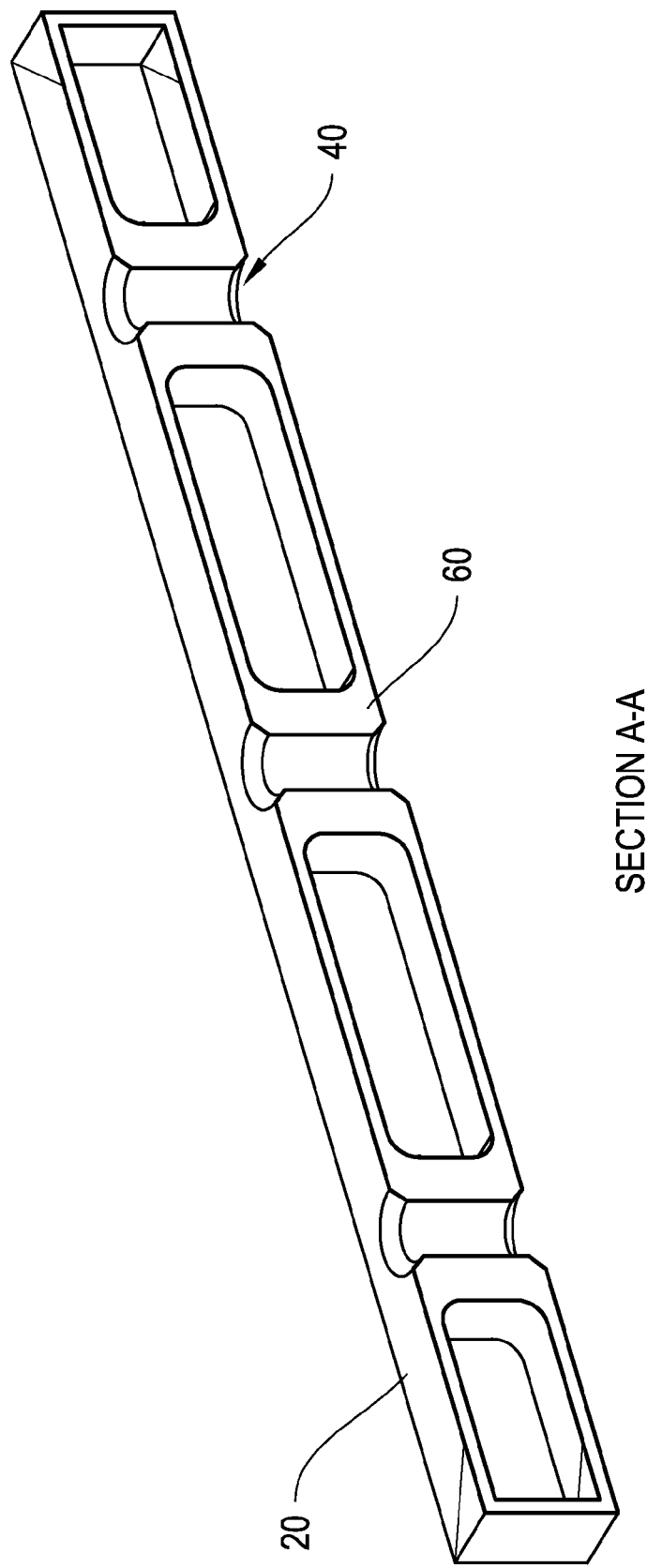
FIG. 4 is a sectional view of the frame member of FIG. 3 taken along section A-A.

FIG. 3 depicts frame 20 in a generally square configuration, while FIG. 4 depicts a cross-section of the frame taken along section A-A. As shown in FIGS. 3 and 4, a series of posts 60 extend vertically between adjacent side walls of frame 20. The number of posts used in the frame, as well as the size and configuration of the posts, can vary depending on the particular application, provided that the posts are large enough to accommodate holes for the attachment bolts or screws. The frame is preferably formed into a channel having a generally U-shaped or C-shaped cross-sectional profile from a suitable metal, such as aluminum, nickel, stainless steel, titanium, and the like, including alloys of the foregoing metals. The channel has opposed side walls and an end wall as shown, with the posts extending between the opposed side wall surfaces.

Figure 5:
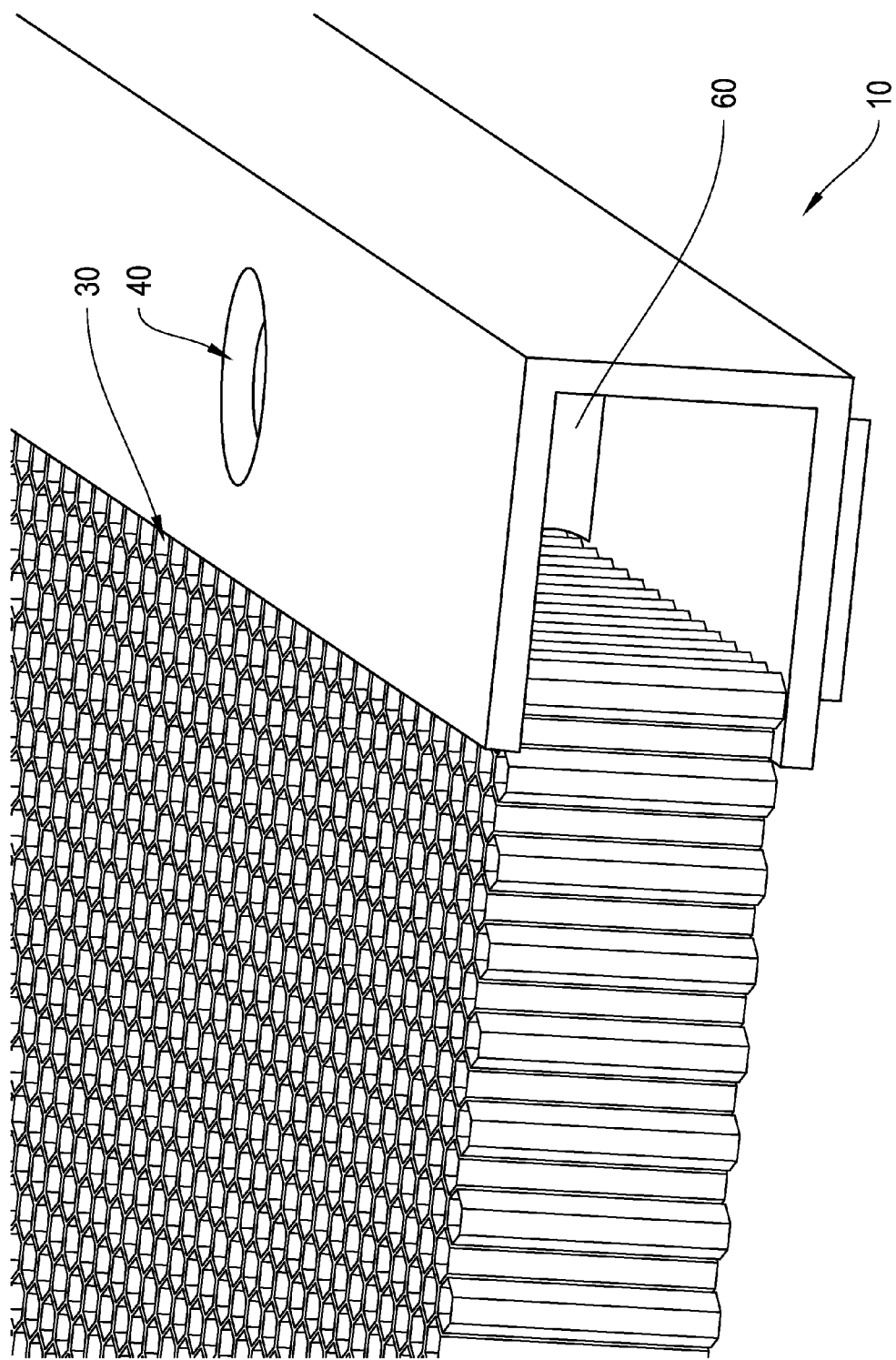
FIG. 5 is a perspective view of a section of the vent panel showing the joined frame and honeycomb medium.

FIG. 5 depicts a section of vent panel 10 showing the interface between frame 20 and medium 30. Also shown is hole 40 and bottom portion of post 60. Medium 30 can preferably be a honeycomb arrangement of hexagonal cells as shown, but it can also be formed from an expanded metal mesh or screen. It is essential that the medium have an open configuration to allow for proper ventilation of the electronics enclosure by admitting cooling air into the enclosure. See, for instance, U.S. Pat. No. 3,821,463, which provides details of the cellular structure of typical media used for vent panels, the relevant disclosure of which is incorporated by reference herein.

As may best be seen with reference to FIG. 5, the medium is received between the adjacent side walls of the frame which extend over the outer edge portion of the medium. The medium can be locked into place and secured to the frame by compression of the frame side walls. Methods for assembly of vent panels having a central medium and a supporting frame member can be found in U.S. Pat. No. 6,211,458, the relevant disclosure of which is incorporated by reference herein.

Optionally, a dust filter (not shown) may be employed in conjunction with medium 30, disposed parallel thereto in a series arrangement relative to the air flow direction. Such filter may be formed of a screen or a high porosity foam or the like which allows for sufficient air flow therethrough while reducing the transmission of dust or other airborne contaminants into the enclosure. The filter may be attached to the outside, relative to the enclosure, of the frame in a conventional manner, but preferably is made to be removable for easier cleaning and replacement.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. An electromagnetic interference (EMI) shielded vent panel for disposition over a corresponding opening formed within a surface of an electronics enclosure, the opening having a predefined outer margin, said vent panel comprising:
an electrically-conductive frame member having a perimeter defining a closed geometry configured to circumscribe the opening of the electronics enclosure, said frame having a generally C-shaped cross-sectional profile including an elongate end wall and an open interior section, and a pair of opposed side walls extending from the end wall and projecting inwardly, said side walls being spaced apart a predetermined distance from each other, said frame being disposable about the opening of the enclosure in electrically-conductive adjacency with the surface thereof, said frame further comprising a series of vertical posts extending between the side walls, said posts being drillable to form fastener-receiving apertures in the posts; and
an electrically-conductive medium having an outer periphery and extending along a transverse axis intermediate a pair of faces defining a thickness dimension therebetween, said medium comprising a plurality of cells which define a plurality of ventilation passageways extending through said thickness dimension generally along said transverse axis, the outer periphery of said medium being received intermediate the inner surfaces of the frame side walls such that each of the frame side walls extends over a corresponding edge portion of the faces of said medium and is in electrical contact therewith.

2. The vent panel of claim 1 wherein the medium comprises a honeycomb structure.

3. The vent panel of claim 2 wherein the individual cells of the honeycomb structure are hexagonal in shape.

4. The vent panel of claim 1 which is fabricated from aluminum, stainless steel, nickel, titanium, and alloys or mixtures thereof.

5. An EMI shielded vent assembly comprising the EMI vent panel of claim 1 and an EMI gasket for mounting the vent panel to the opening.

6. The EMI shielded vent assembly of claim 5 which is mounted on an internal or external aircraft surface.

\* \* \* \* \*